US010790013B1

(12) United States Patent
Dubey et al.

(10) Patent No.: US 10,790,013 B1
(45) Date of Patent: Sep. 29, 2020

(54) READ-WRITE ARCHITECTURE FOR LOW VOLTAGE SRAMS

(71) Applicant: Synopsys, Inc., Mountain View, CA (US)

(72) Inventors: Prashant Dubey, Greater Noida (IN); Ishita Satishchandra Desai, Surat (IN); Shivangi Mittal, Delhi (IN); Surya Prakash Gupta, Korba (IN); Jamil Kawa, Campbell, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 16/026,038

(22) Filed: Jul. 2, 2018

Related U.S. Application Data

(60) Provisional application No. 62/528,032, filed on Jun. 30, 2017.

(51) Int. Cl.
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC .............................. G11C 11/419; G11C 11/412
See application file for complete search history.

(56) References Cited

U.S. PATENT DOCUMENTS

| | | | | |
|---|---|---|---|---|
| 9,070,477 | B1* | 6/2015 | Clark | G11C 11/419 |
| 2006/0044868 | A1* | 3/2006 | Swanson | G11C 11/16 365/171 |
| 2007/0297249 | A1* | 12/2007 | Chang | G11C 11/412 365/189.11 |
| 2011/0085371 | A1* | 4/2011 | Wang | G11C 8/16 365/156 |
| 2014/0185364 | A1* | 7/2014 | Iyer | G11C 8/16 365/154 |
| 2015/0357009 | A1* | 12/2015 | Sinangil | G11C 8/08 365/156 |
| 2015/0380080 | A1* | 12/2015 | Jung | G11C 11/419 365/72 |
| 2016/0093365 | A1* | 3/2016 | Song | G11C 11/419 365/154 |
| 2019/0081627 | A1* | 3/2019 | Lilja | H03K 19/0013 |

OTHER PUBLICATIONS

Saito, Takahiko, et al. "A Ratio-Less 10-Transistor Cell and Static Column Retention Loop Structure for Fully Digital SRAM Design." 2012 4th IEEE International Memory Workshop, 2012. (Year: 2012).*
Calhoun, Benton, et al "Static noise margin variation for sub-threshold sram in 65-nm cmos", Jul. 2006, IEEE Journal of Solid-State Circuits, pp. 1673-1679, vol. 41 No. 7.
(Continued)

*Primary Examiner* — Jay W. Radke
(74) *Attorney, Agent, or Firm* — HIPLegal LLP; Judith Szepesi

(57) ABSTRACT

An SRAM cell in a bit interleaved memory architecture with two phase sequential write scheme to achieve 100% write ability and the SNM target with bit interleaved architecture in SRAM.

20 Claims, 9 Drawing Sheets

(56) References Cited

OTHER PUBLICATIONS

Chandra, Vikas et. al., "On the Efficacy of Write-Assist Techniques in Low Voltage Nanoscale SRAMs" 2010, pp. 345-350, in Design, Automation Test in Europe Conference Exhibition (DATE) 2010, European Design and Automation Association, Leuven Belgium.

Chang, Ik Joon, et al. "A 32 kb 10t sub-threshold sram array with bit-interleaving and dierential read scheme in 90 nm cmos.", Feb. 2009, IEEE Journal of Solid-State Circuits, vol. 44 No. 2 pp. 650-658.

Chang, Meng-Fan, et al. "17.3 A 28nm 256kb 6T-SRAM with 280mV improvement in Vmin using a dual-split-control assist scheme", Feb. 2015, in Solid-State Circuits Conference—(ISSCC), 2015 IEEE International, pp. 1-3.

Chen, Yen-Huei et al., "13.5 A 16nm 128Mb SRAM in high-K metal-gate FinFET technology with write-assist circuitry for low-VMIN applications," 2014 IEEE International Solid-State Circuits Conference Digest of Technical Papers (ISSCC), San Francisco, CA, 2014, pp. 238-239.

Fan, Ming-Long et al., "Analysis of Single-Trap-Induced Random Telegraph Noise on FinFET Devices, 6T SRAM Cell, and Logic Circuits," in IEEE Transactions on Electron Devices, Aug. 2012, pp. 2227-2234, vol. 59, No. 8, IEEE.

Fujimura, Yuki et al., "A configurable SRAM with constant-negative-level write buffer for low-voltage operation with 0.149 μm2 cell in 32nm high-k metal-gate CMOS," 2010 IEEE International Solid-State Circuits Conference—(ISSCC), San Francisco, CA, 2010, pp. 348-349, IEEE.

Grossar Evelyn et al., "Read Stability and Write-Ability Analysis of SRAM Cells for Nanometer Technologies," in IEEE Journal of Solid-State Circuits, vol. 41, No. 11, pp. 2577-2588, Nov. 2006, IEEE.

Jain, Shailendra et al., "A 280mV-to-1.2V wide-operating-range IA-32 processor in 32nm CMOS," 2012 IEEE International Solid-State Circuits Conference, San Francisco, CA, 2012, pp. 66-68, IEEE.

Kim, Tae-Hyoung et al., "A voltage scalable 0.26V, 64kb 8T SRAM with Vmin lowering techniques and deep sleep mode," 2008 IEEE Custom Integrated Circuits Conference, San Jose, CA, 2008, pp. 407-410, IEEE.

Myers, James et al., "8.1 An 80nW retention 11.7pJ/cycle active subthreshold ARM Cortex-M0+ subsystem in 65nm CMOS for WSN applications," 2015 IEEE International Solid-State Circuits Conference—(ISSCC) Digest of Technical Japers, San Francisco, CA, 2015, pp. 1-3, IEEE.

Nho, Hyunwoo et al., "A 32nm High-k metal gate SRAM with adaptive dynamic stability enhancement for low-voltage operation," 2010 IEEE International Solid-State Circuits Conference—(ISSCC), San Francisco, CA, 2010, pp. 346-347.

Nii, Koji, et al., "A 45-nm single-port and dual-port SRAM family with robust read/write stabilizing circuitry under DVFS environment," 2008 IEEE Symposium on VLSI Circuits, Honolulu, HI, 2008, pp. 212-213, IEEE.

Pilo, Harold et al., "An SRAM Design in 65nm and 45nm Technology Nodes Featuring Read and Write-Assist Circuits to Expand Operating Voltage," 2006 Symposium on VLSI Circuits, 2006. Digest of Technical Papers., Honolulu, HI, 2006, pp. 15-16, IEEE.

Qazi, Masood, et al., "Challenges and Directions for Low-Voltage SRAM," in IEEE Design & Test of Computers, vol. 28, No. 1, pp. 32-43, Jan.-Feb. 2011, IEEE.

Samandari-Rad, Jeren et al., "Confronting the Variability Issues Affecting the Performance of Next-Generation SRAM Design to Optimize and Predict the Speed and Yield," in IEEE Access, 2014, pp. 577-601, vol. 2, IEEE.

Shibata, Nobutaro et al., "A 0.5-V 25-MHz 1-mW 256-kb MTCMOS/SOI SRAM for solar-power-operated portable personal digital equipment—sure write operation by using step-down negatively overdriven bitline scheme," in IEEE Journal of Solid-State Circuits, pp. 728-742, Mar. 2006, vol. 41, No. 3, IEEE.

Wang, Jiajing et al., "Analyzing static and dynamic write margin for nanometer SRAMs," Proceeding of the 13th international symposium on Low power electronics and design (ISLPED '08), Bangalore, pp. 129-134, 2008, IEEE.

Yabuuchi, Makoto et al., "13.3 20nm High-density single-port and dual-port SRAMs with wordline-voltage-adjustment system for read/write assists," 2014 IEEE International Solid-State Circuits Conference Digest of Technical Papers (ISSCC), pp. 234-235, 2014, IEEE, San Francisco, CA.

Yamaoka, Masanao et al, "65nm Low-Power High-Density SRAM Operable at 1.0V under 3σ Systematic Variation Using Separate Vth Monitoring and Body Bias for NMOS and PMOS," 2008 IEEE International Solid-State Circuits Conference—Digest of Technical Papers, San Francisco, CA, 2008, pp. 384-622.

Zhai, Bo et al., "A Variation-Tolerant Sub-200 mV 6-T Subthreshold SRAM," in IEEE Journal of Solid-State Circuits, pp. 2338-2348, Oct. 2008, vol. 43, No. 10, IEEE.

Zimmer, Brian et al., "SRAM Assist Techniques for Operation in a Wide Voltage Range in 28-nm CMOS," in IEEE Transactions on Circuits and Systems II: Express Briefs, pp. 853-857, Dec. 2012, vol. 59, No. 12, IEEE.

\* cited by examiner

CONVENTIONAL CIRCUIT

CONVENTIONAL CIRCUIT

| Energy consumed by Array | 8T memory (operating @ 0.6V) | 6T memory with NBL (operating @ 0.81V) |
|---|---|---|
| Real Energy (pJ/cycle) | 3.869 | 12.025 |
| Write Energy (pJ/cycle) | 5.039 | 16.796 |

Figure 3C

READ-WRITE ARCHITECTURE FOR LOW VOLTAGE SRAMS

RELATED APPLICATION

The present application claims priority to U.S. Provisional Patent No. 62/528,032, filed on Jun. 30, 2017, and incorporates that application in its entirety.

FIELD

The present invention relates to SRAM memory cells and more particularly to an improved read-write architecture for SRAM memory cells.

BACKGROUND

Low power consumption and high yield of embedded SRAMs is critical for IoT (Internet of Things) and Systems on a Chip (SoCs) markets. Power consumption can be minimized by operating at the lowest voltage (known as VDDmin), which is set by the static noise margin (SNM) and write margin (WM) of the SRAM's bit cell.

SNM and WM are strongly correlated to the threshold voltage (Vt) fluctuation of the bit cell transistors and defined by the six-sigma weak bit cell around their mean respective global corners. State-of-art SRAM designs use write assist circuits to improve the write ability at low voltage, but write assist circuits consume extra power and area. To maximize power reduction and achieve a desired target yield of SRAMs, several write and stability assist circuits have been proposed to reduce VDDmin to near threshold. Word-line boost and negative bit-line techniques need an over-sized boost capacity to operate at lower voltages. At higher voltages, the over-sized boost capacity creates an excessive gate to source voltage which enhances the electrical stress on the bit-cell pass gates degrading reliability and lowering SNM for the unselected cells. Furthermore, these techniques consume extra dynamic power.

FIGS. 1A and 1B show examples of conventional 10 transistor (10T) bit cells for low voltage. FIG. 1A shows one such cell which has a very good write ability without any write assist and which has no stability problems if used in non-bit-interleaved architecture. If logic 1 is to be written into memory, pass gates NMOS and PMOS are ON and power supply gates N13 and P13 will be in OFF state, which ensures 100% write ability. FIG. 1B shows a conventional 10T bit cell with good half-select stability (hold stability) but poor write ability. In the 10T bitcell shown in FIG. 1B, having the two switches be write pass gates, provides the capability to have control from both row and column. Thus, bit-cell hold and read stability is achieved along with higher density. However, the two switches in series in the pass-gate in the 10T bitcell make the write more difficult.

At low operating voltage and long standby times, hold stability is a big concern. Bit-interleaving reduces the impact of multiple event upsets (MEUs) occurring on adjacent bit-cells as shown in FIG. 2.

In a bit-interleaved arrangement, all the bits of any given word are not stored adjacent to each other. However, bits of multiple words are mixed in a predefined order. These bits of different words are kept adjacent to each other and connected to a single select word-line or a row select line. In this system, there are multiple words selected. e.g. CM4 means column mux 4 where bits of 4 words are interleaved. There is a column multiplexer (MUX) generally near memory input/output (IO), which selects the bits of the desired word for any read or write operation and connects the same to the IO. FIG. 2 shows an 8 bit un-interleaved word and contrasts it with an 8 bit interleaved word.

Furthermore, any bit cell in a bit-interleaving memory may be selected in two modes, selected and half-selected. The bits which are not under operation are in half-selected mode. When any bit-cell is in half-selected mode, the design effort is to preserve the data stored in it (hold stability). However, when the same bit-cell is in fully selected mode for write, the previous design effort, to improve the stability interferes with the writability of the cell. Thus, it is difficult to achieve the write ability, hold stability, and read-stability of the same bit-cell in a bit-interleaved architecture.

The bit-cell in FIG. 1A, suffers from the half-selected cells having a high static noise margin (SNM) in the bit-interleaved architecture. As the bit-line voltage level will be passed into the bit-cell, full-complementary pass-gates can pass any analog voltage.

FIG. 1B shows a low voltage 10-T bit-cell, which is has a good SNM in a bit-interleaved bit-cell. However, it has a degraded write-margin which means it needs a larger write assist than the classical 6-T bit-cell (due to the series pass-gates).

BRIEF DESCRIPTION OF THE FIGURES

The present invention is illustrated by way of example, and not by way of limitation, in the figures of the accompanying drawings and in which like reference numerals refer to similar elements and in which:

FIG. 3C shows an example comparison of energy consumption of a conventional 6T (6 transistor) memory and an embodiment of the improved read architecture 8T memory, for a read cycle and a write cycle.

DETAILED DESCRIPTION

The present application is directed to a Static Random Access Memory (SRAM) memory cell with a two phase sequential write scheme to achieve 100% writability and the Static Noise Margin (SNM) target with bit interleaved architecture in SRAM. In one embodiment, this is achieved without using assist technique using a low voltage bit-cell.

The following detailed description of embodiments makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Figure 4A:
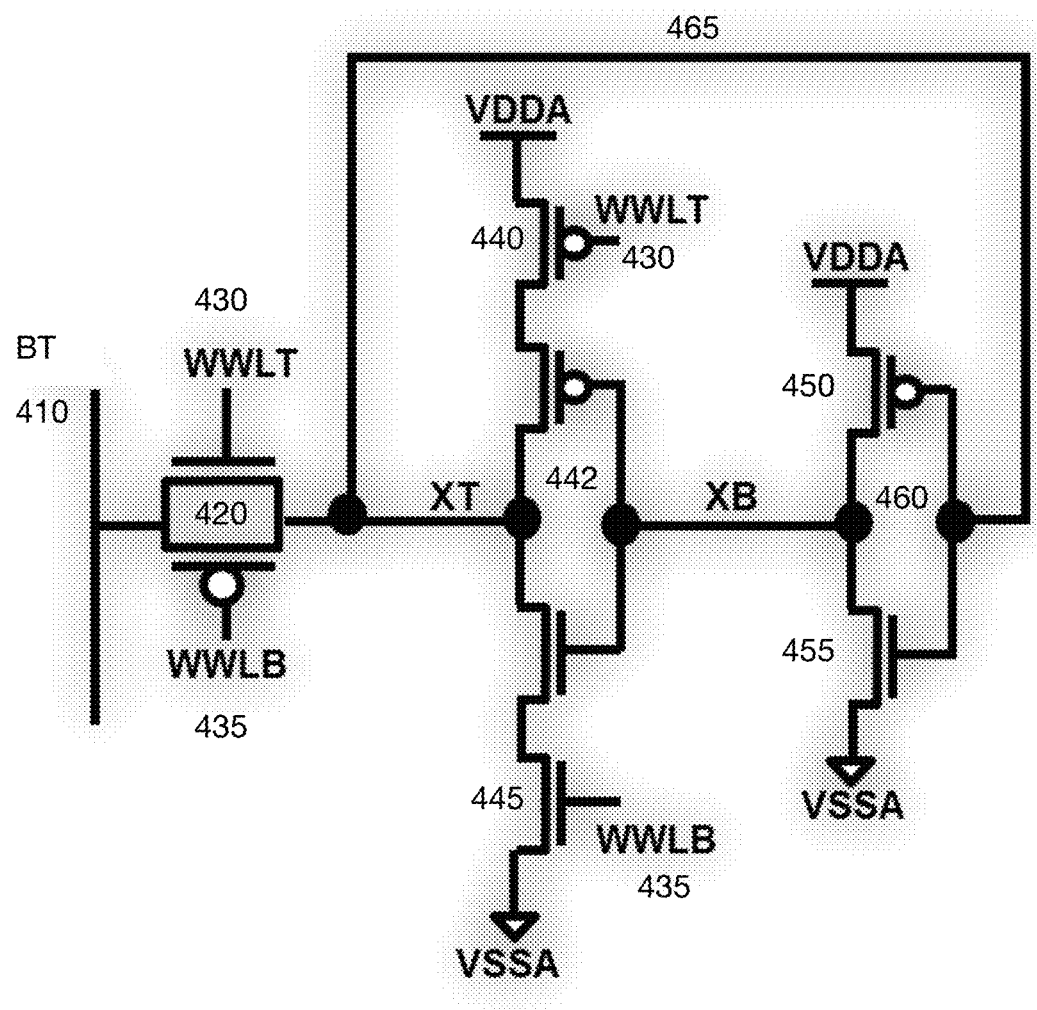
FIG. 4A is a circuit diagram of one embodiment of the improved read architecture memory cell.

FIG. 4A is a circuit diagram of one embodiment of the SRAM memory cell. In FIG. 4A, bit line BT 410 connects to access transistors 420 which receive input from Write Word Line True (WWLT) 430 and Write Word Line Bar (WWLB) 435. Access transistors 420 comprise an NMOS access transistor controlled by WWLT and a PMOS access transistor controlled by WWLB. Access to the cell is enabled by write word line true (WWLT) 430 and write word line bar (WWLB) 435, which control the access transistors 420, which in turn control whether the cell is coupled to the bit line 410.

PMOS pass-gate 440 receives the WWLT signal 430 and is connected between VDDA and inverter 442 of bit latch. NMOS pass-gate (footer) 445 receives the WWLB signal 435 and is connected between VSSA and inverter 442 of the bit latch. PMOS pass-gate 440 and NMOS pass-gate 445 form an enable element.

Figure 7:
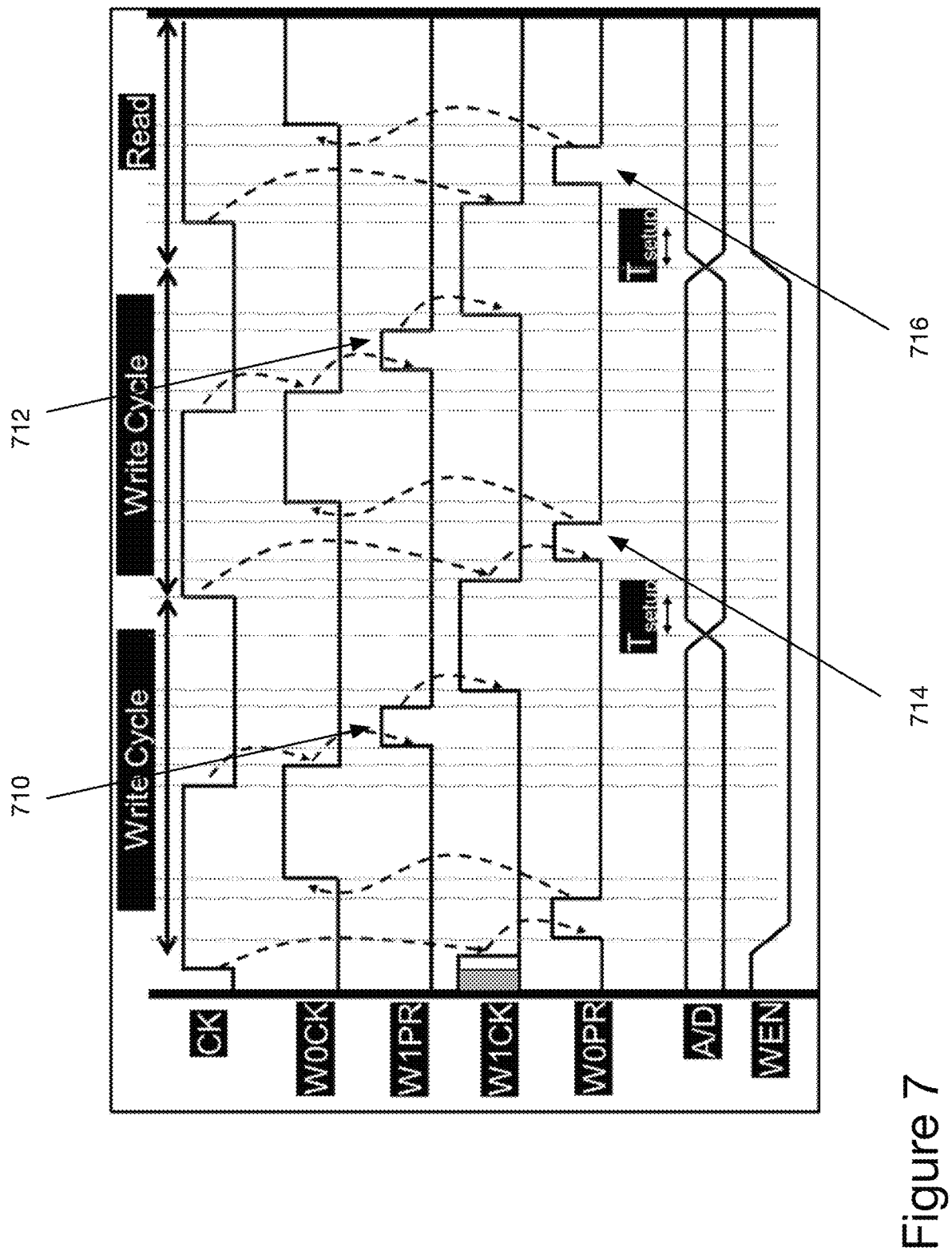
FIG. 7 shows one embodiment of the detailed timing diagram of the control signals generated in various phases for a write operation.

FIGS. 4B-4E show the circuit of FIG. 4A, illustrating one embodiment of the sequence of operations of the circuit of FIG. 4A. The embodiment of FIGS. 4A-4E works on a two phase write methodology where write "0" and write "1" are done in sequential phases using two clocks. One embodiment of the clock signal sequencing is shown in FIG. 7.

To ensure the stability of half-selected cells, write "0" and write "1" are done in sequential phases separated by a guard time window during which time the bit-lines are pre-charged. Bit-lines of the half-selected cells are pre-charged to values opposite that of the write column which helps to achieve the desired SNM as the "ON" pass-gates (access transistors) of the half-selected cells do not favor passing the opposite value.

Figure 5:
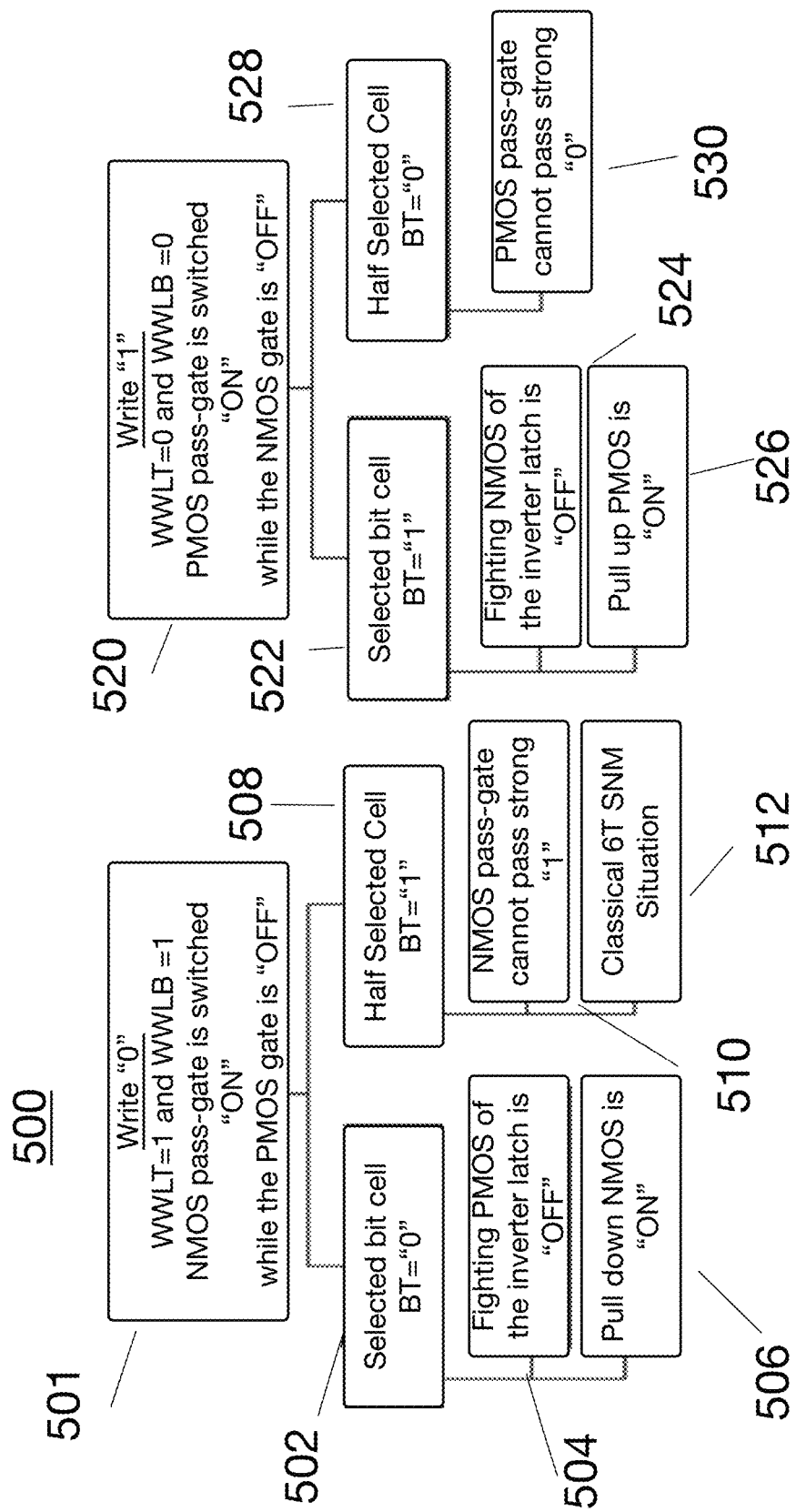
FIG. 5 is a flow chart for write "0" and write "1" operations in accordance with an embodiment of the invention.

FIG. 5 is a flow chart 500 of one embodiment of the write "0" and write "1" operations.

Write "0" Operation.

Figure 4B:
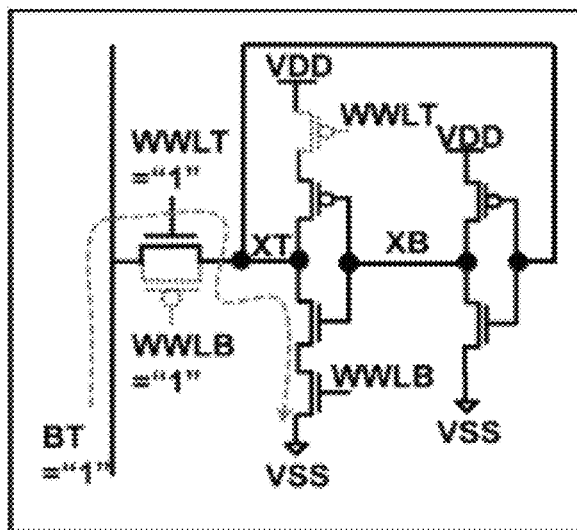
FIGS. 4B-4E show the signal flow in operation for the circuit diagram of FIG. 4A.

As shown in FIG. 4B (and block 501 of FIG. 5) for write "0", WWLT (Write Word Line True) is switched ON (WWLT="1") and WWLB (Write Word Line Bar (complementary) is switched OFF (WWLB="1"). Selected cell bit-line BT is switched to "0" (block 502). In this case, only the NMOS pass-gate is switched "ON" while the PMOS pass gate is "OFF" and the potentially fighting pull-up PMOS of the latch is switched OFF (block 504) and pull down NMOS is "ON" (block 506). There is no conflict or fighting between pull down NMOS and potentially fighting pull up PMOS.

Write "1" Operation.

Figure 4C:
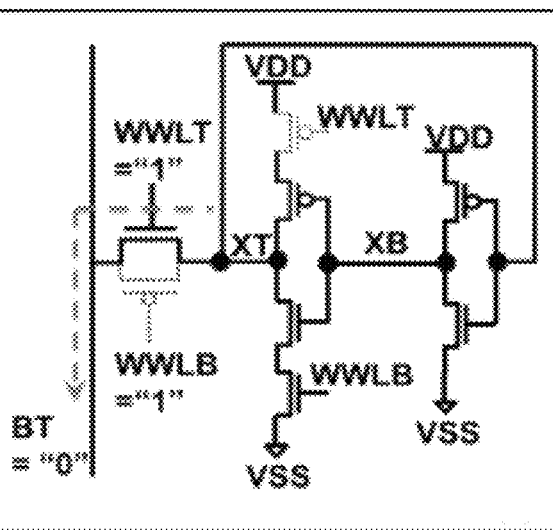
Figure 4D:
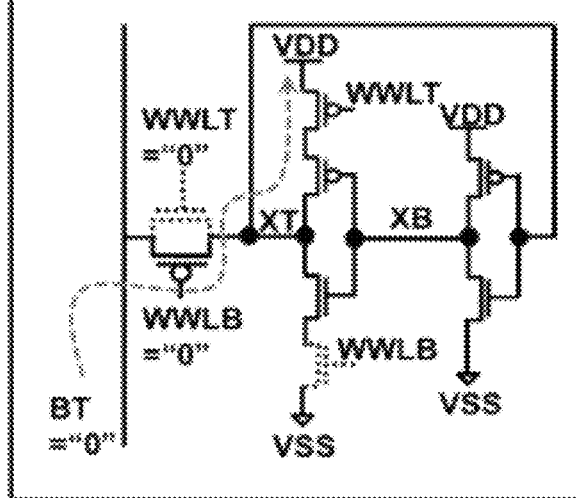

As shown in FIG. 4C (and block 520 of FIG. 5) for write "1", word-line WWLT is set to OFF ("WWLT="0"), and WWLB is ON (WWLB="0"). Selected cell bit-line BT is set to "1" (block 522). In this case, only PMOS pass-gate is switched "ON" while the NMOS pass-gate is "OFF" (block 526) and the fighting pull-down NMOS transistor 445 is OFF (block 524). Thus, 100% write ability is achieved since the potentially opposing or fighting pull-up transistor (440 in case of write "0") or pull-down transistor (445 in case of write "1") is switched "OFF."

Half-Selected Cells in Case of Write "0".

FIG. 4C (and blocks 508-512) shows the case of half-selected cells on the same row during a write "0" operation. In case of write "0", bit-lines of half-selected cells are kept at the value opposite of the value being written, i.e. "1" (block 508). "ON" NMOS access transistor 445 does not favor passing of "1" which ensures hold stability or read stability of the cell (blocks 510 and 512).

Half-Selected Cells in Case of Write "1".

Figure 4E:
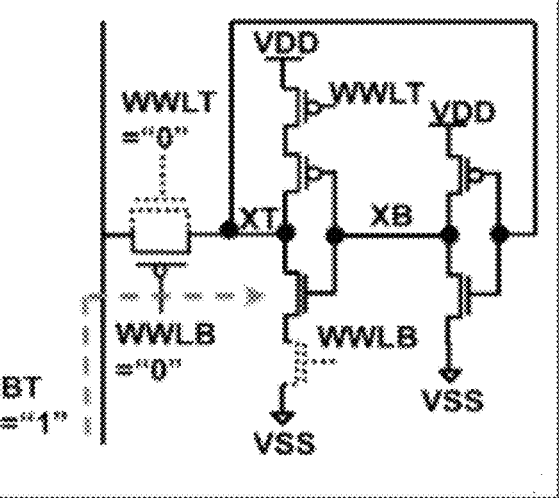

FIG. 4E (and blocks 528-530) shows the case of half-selected cells in a write "1" operation. Bit-lines of half-selected cells are kept at the value opposite of the value being written, i.e. "0" (block 528). "ON" PMOS access transistor 440 does not favor passing of "0" which ensures hold stability or read stability of the cell (block 530).

With this scheme, the system achieves stability of the half-selected cells without increasing the static noise margin, as NMOS pass-gate cannot pass a strong "1" and PMOS pass-gate cannot pass a strong "0".

Figure 6:
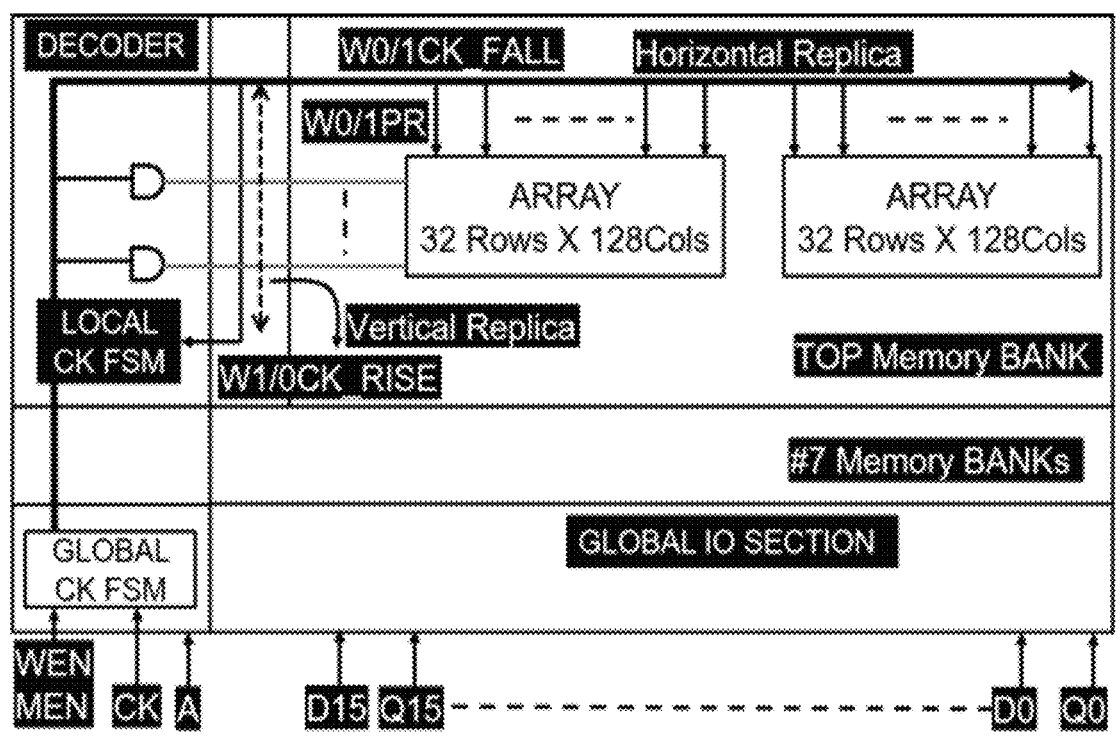
FIG. 6 is a signal flow, showing one embodiment of the internal timing control signals.

FIG. 6 is a signal flow, showing one embodiment of the internal timing control signals.

FIG. 7 shows one embodiment of the detailed timing diagram of the control signals generated in various phases for the write operation.

A Write "0" operation is done by generating W0CK clock in response to a positive edge of the clock CK as shown in FIG. 7. Write "0" finishes in response to a negative edge of W0CK and W1PR is generated to pre-charge the bit-lines to all "1". A Write "1" operation follows the write "0" operation by precharging a bit-line to "1" followed by generating W1CK in response to the negative edge of W1PR. Each write is followed by a guard window, W1PR after a 0 write, and W0PR after a 1 write. Bit-lines are pre-charged and discharged during the guard windows, W1PR, W0PR respectively. The guard windows occur when W1PR is high 710, 712, or when W0PR is high 714, 716.

Write "0" Operation Cycle.

In response to a positive edge of clock CK, Write1 clock W1CK goes low switching OFF the word-line WWLB i.e. completion of write "1" operation. In response to the falling of clock W1CK, pre-charge signal W0PR goes high. During this window, data to be written is transferred to the selected bit-lines and unselected bit-lines are pre-charged to "1". Write0 clock W0CK remains low during this cycle.

Falling of the signal W0PR enables write0 clock W0CK which in turn switches ON the word-line WWLT. Write1 clock W1CK remains low. During this period, selected cell bit-lines are kept at their data point values and unselected bit-lines are kept at "1". This is a write "0" operation cycle.

Write "1" Operation Cycle

In response to a negative edge of clock CK, write0 clock W0CK goes low switching OFF the word-line WWLT. Pre-charge signal W1PR goes high in response to the falling edge of clock W0CK. Pre-charge signal W1PR is the guard window between write0 clock W0CK and write 1 clock W1CK. During this time, unselected bit-lines are pre-charged to "0".

In response to the negative edge of the signal W1PR, write1 clock W1CK is switched ON which switches ON WWLB. Write0 clock W0CK remains low. During this period, selected cell bit-lines are kept at their data point values and unselected bit-lines are kept at "0". This is a write "1" cycle. During both pre-charge windows, both write0, write1 clock remain inactive.

EXPERIMENTAL COMPARISONS

Figure 1A:
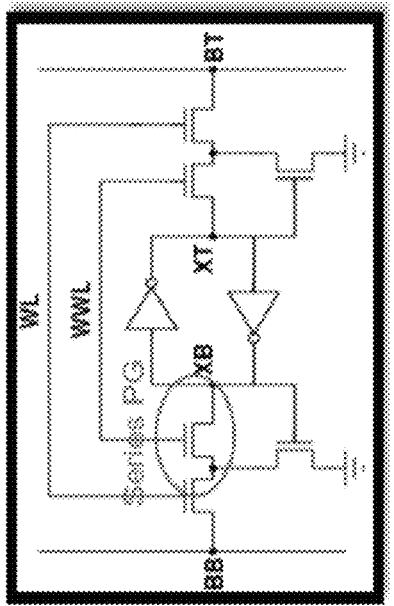
FIGS. 1A and 1B show examples of conventional 10 transistor (10T) bit cells for low voltage.
Figure 1B:
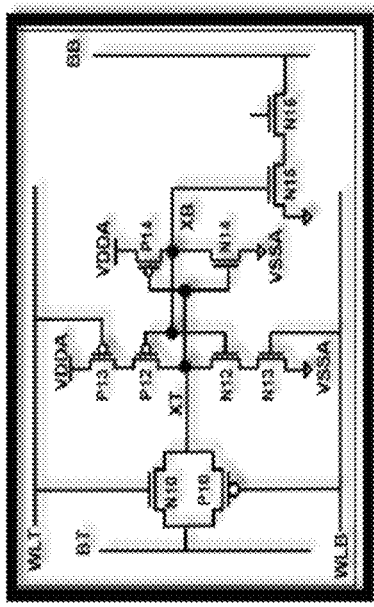
Figure 2:
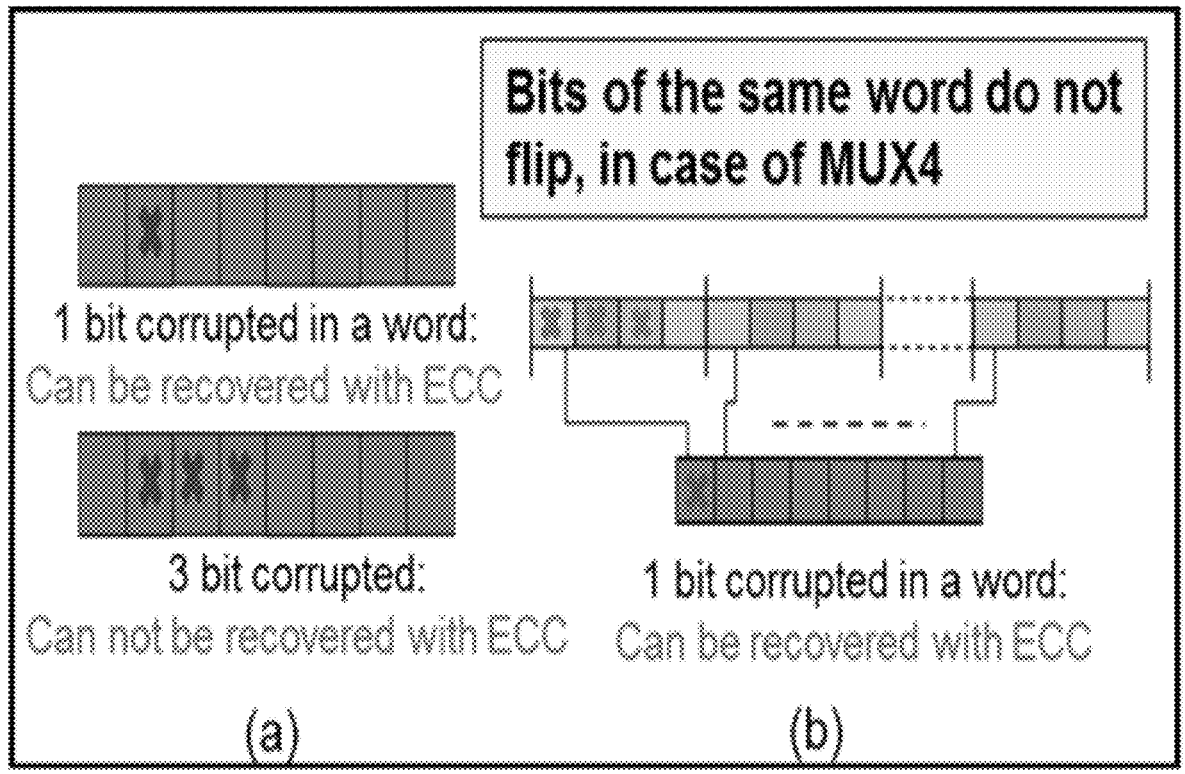
FIG. 2 shows an example of bit-interleaving.
Figure 3A:
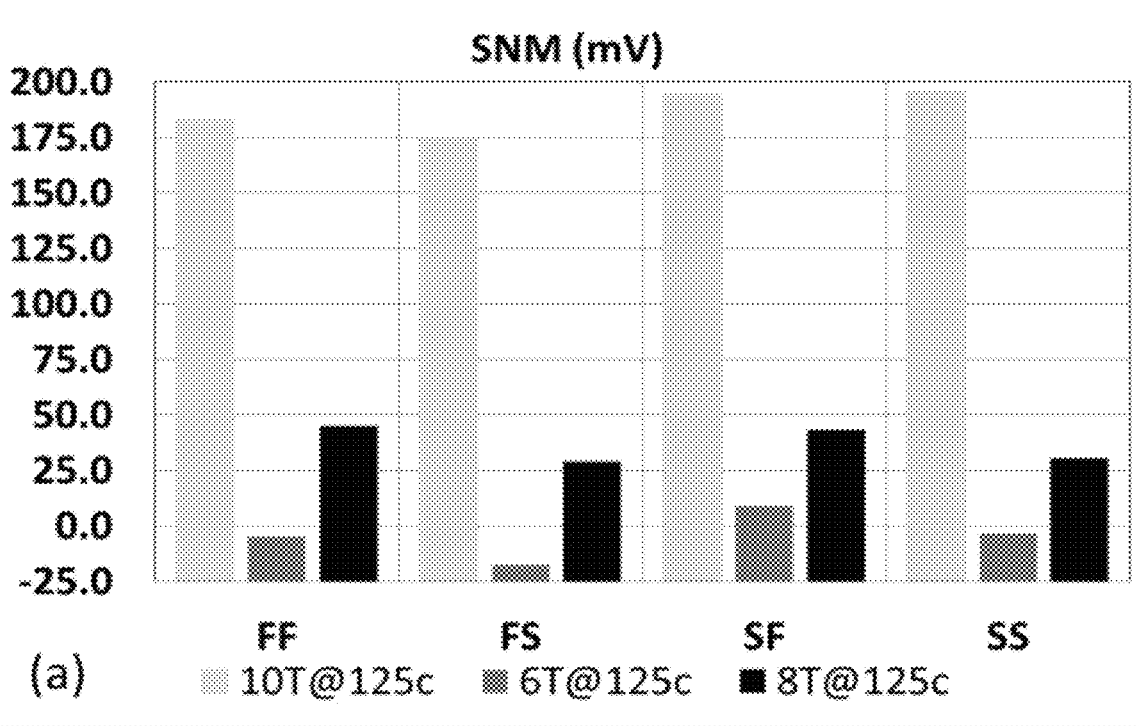
FIG. 3A shows an example comparison of the static noise margin (SNM) of a conventional 6T (6 transistor) memory, a conventional 10T memory, and an embodiment of the improved read architecture 8T memory, where the y axis represents SNM in mVolts.
Figure 3B:
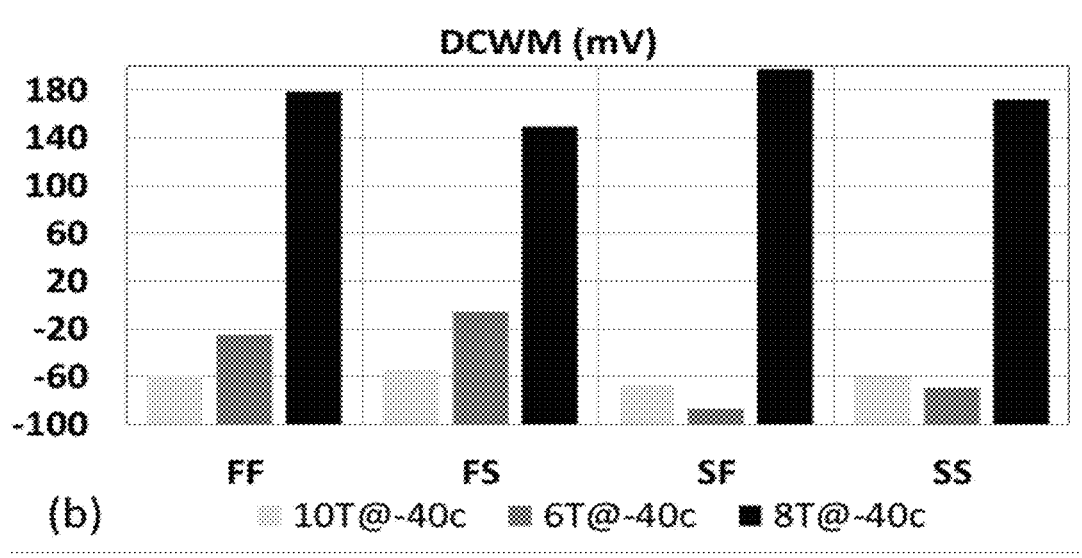
FIG. 3B shows an example comparison of the DC write margin (DCWM) of a conventional 6T (6 transistor) memory, a conventional 10T memory, and an embodiment of the improved read architecture 8T memory, where the y axis represents DCWM in mVolts.

FIG. 3A shows an example comparison of the SNM of a conventional 6T (6 transistor) memory, a conventional 10T memory, and an embodiment of the present 8T memory, where the y axis represents SNM in mVolts. The examples shown in FIGS. 3A-3C are achieved with a target cycle time of 40 ns. FIG. 3A shows FF, FS, SF, and SS (respectively, Fast NMOS, Fast PMOS; Slow NMOS, Slow PMOS), which are the process corners to check the effects of process variation on a circuit). The results for the 8T embodiment, tested at 125 degrees Celsius range between 25 and 50 mV in the example shown, compared to a much higher SNM for the 10T conventional memory.

FIG. 3B shows an example comparison of the DC write margin (DCWM) of a conventional 6T (6 transistor) memory, a conventional 10T memory, and an embodiment of the presently described 8T memory, where the y axis represents DCWM in mVolts. The DCWM for the 8T embodiment, tested at 125 degrees Celsius is between 142 and 190 mV, compared to much lower DCWM for the 10T conventional memory.

FIG. 3C shows an example comparison of a conventional 6T (6 transistor) memory and an embodiment of the present 8T memory, for a read cycle and a write cycle. The real energy and the write energy (pJ/cycle) of the conventional 6T memory is more than triple that of the 8T memory. The write power of the write0/write1 architecture 8T SRAM in accordance with embodiments described comes down to 5.39 pJ/cycle.

In contrast, as shown in FIG. 3C, a conventional 64 Kb, 6T bit-cell memory SRAM, working at 810 mV, using negative bit-line (NBL) write assist architecture consumes 16.796 pJ/cycle write power, of which 7.22 pJ/cycle is consumed by the negative bit-line capacitances, which are charged in every cycle.

At this large voltage, the OFF transistors in column multiplexer (CMUX) and write driver turn ON resulting in a reliability risk. Thus, minimum voltages at which the conventional 6T memory solution can work with the NBL write assist is 810 mV. Furthermore, more read energy is consumed due to the higher operating voltage and at 15% WLUD for stability assist. In contrast, the 8T bit-cell memory using the described sequential write scheme can operate at (or below) 600 mV, saving on read and write power.

The embodiment of a sequential asymmetric 8T bit-cell architecture can successfully operate without a write assist at the lowest voltage of operation. In one embodiment, the 8T memory achieves a low voltage operation through sequential word-line selection which differs from conventional circuits.

In some embodiments, for the FS and FF corners the system may apply an SNM assist to achieve the target SNM. However, this does not degrade write margin because in one embodiment the word line underdrive (WLUD) assist is only applied in the FF and FS corner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A method of writing to an SRAM including a plurality of bit cells, the method comprising:
   for a first write cycle, identifying a first subset of bit cells to each of which "0" will be written, and a second subset of bit cells to each of which "1" will be written;
   in response to a rising edge of a clock signal, writing "0" into each of the first subset of bit cells in the SRAM;
   in response to a falling edge of the clock signal and a signal indicating an end of a first guard window time period, writing "1" into the second subset of bit cells in the SRAM.

2. The method of claim 1, wherein either the first subset or the second subset has zero bit cells in the SRAM.

3. The method of claim 1, further comprising:
   evaluating process corners in the SRAM; and
   adding a word line underdrive (WLUD) assist for an identified process corner among said process corners.

4. The method of claim 3, wherein said process corners include fast NMOS, fast PMOS, slow NMOS, and slow PMOS.

5. A static random access memory (SRAM) memory for inclusion in a current word of an interleaved memory architecture, comprising:
   a memory latch for storing a bit value;
   a PMOS pass-gate transistor between VDDA and the memory latch, the PMOS pass-gate controlled by a write word line true (WWLT) signal;
   an NMOS pass-gate transistor between VSSA and the memory latch controlled by a write word line bar (WWLB) signal;
   access transistors, comprising a first access transistor and a second access transistor controlled by the WWLT and WWLB signals, determining whether or not to write the bit value to the memory latch of the current word;
   a bit line coupled through the first access transistor or the second access transistor to the PMOS pass gate transistor or the NMOS pass-pate transistor, indicating the bit value to write to the memory latch, wherein "0" values are written sequentially with "1" values, with a guardian time window between the writes.

6. The SRAM memory of claim 5, wherein the first access transistor and the second access transistor comprise:
   a NMOS access transistor controlled by the WWLT signal; and
   an PMOS access transistor controlled by the WWLB signal.

7. The SRAM memory of claim 5, wherein in operation of the SRAM memory, the SRAM memory
   in a first write cycle, identifies a first subset of bit cells to each of which "0" will be written, and a second subset of bit cells to each of which "1" will be written,
   in response to a rising edge of a clock signal, writes a "0" into each of the first subset of bit cells in the SRAM,
   in response to a falling edge of the clock signal and a signal indicating an end of the guardian time window, writes a "1" into each of the second subset of bit cells in the SRAM.

8. The SRAM memory of claim 5, wherein the memory is a bit interleaved memory.

9. A method of writing values into bit cells in a memory bit-interleaved architecture, comprising:

in response to a rising edge of a clock signal, writing a "0" into a first one of the bit cells of the word of bit cells; and in response to a falling edge of the clock signal and a signal indicating an end of a first guard window time-period, writing a "1" into a second one of the bit cells of the word.

10. The method of claim 9, further comprising:

upon detecting a rising edge of the clock signal and a signal indicating an end of a second guard window time-period, writing a "0" into a third bit cell of the word.

11. The method of claim 9, further comprising:

setting a write word line true (WWLT) and a write word line bar (WWLB) to "0", resulting in a PMOS pass-gate of the second one of the bit cells being switched on and an NMOS pass-gate of the second one of the bit cells being switched off;

setting a selected bit line of the second one of the bit cells to "1";

wherein the setting the WWLT, the WWLB and the selected bit line of the second one of the bit cells results in setting a potentially fighting pull-down NMOS gate of the second one of the bit cells to OFF and a pull-up PMOS gate of the second one of the bit cells to ON, allowing the "1" to be written to the second one of the bit cells; and setting the bit line of a bit cell to "0", resulting in the PMOS access transistor of the bit cell being unable to pass a strong "0" value, and creating the guard window time-period before a "0" value can be written to the first one of the bit cells.

12. The method of claim 9, further comprising:

concurrently with the writing the "0" into a the first one of the bit cells, additionally writing of the "0" into a plurality of other bit cells.

13. The method of claim 9, further comprising:

evaluating process corners in the SRAM; and adding a word line underdrive (WLUD) assist for an identified process corner of said process corners.

14. The method of claim 13, wherein the process corners include fast NMOS, fast PMOS, slow NMOS, and slow PMOS.

15. The method of claim 9, wherein each of the bit cells in the memory bit-interleaved architecture includes a memory latch for storing a bit value, a PMOS pass-gate transistor between VDDA and the memory latch, the PMOS pass-gate transistor controlled by a write word line true (WWLT) signal, an NMOS pass-gate transistor between VSSA and the memory latch controlled by a write word line bar (WWLB) signal, and an access gate controlled by the WWLT signal and the WWLB signal, determining whether or not to write the bit value to the memory latch.

16. The method of claim 15, wherein a bit line indicating the bit value to write into the memory latch is coupled through one of a first access transistor and a second access transistor of the access gate, to the NMOS pass-gate transistor or to the PMOS pass gate transistor.

17. The method of claim 1, wherein each of the bit cells in SRAM includes a memory latch for storing a bit value, a PMOS pass-gate transistor between VDDA and the memory latch, the PMOS pass-gate controlled by a write word line true (WWLT) signal, an NMOS pass-gate transistor between VSSA and the memory latch controlled by a write word line bar (WWLB) signal, and an access gate transistor controlled by the WWLT signal and the WWLB signal, determining whether or not to write the bit value to the memory latch.

18. The method of claim 17, wherein a bit line is coupled through one of a first access transistor and a second access transistor of the access gate, to the NMOS pass gate transistor or the PMOS pass-gate transistor.

19. The SRAM memory of claim 5, further comprising:

a word line underdrive (WLUD) assist added to the SRAM memory for an identified process corner among evaluated process corners in the SRAM.

20. The SRAM memory of claim 19, further comprising:

wherein the evaluated process corners include fast NMOS, fast PMOS, slow NMOS, and slow PMOS.

* * * * *